US005807660A

United States Patent [19]

Lin et al.

[11] Patent Number: 5,807,660

[45] Date of Patent: Sep. 15, 1998

[54] AVOID PHOTORESIST LIFTING BY POST-OXIDE-DEP PLASMA TREATMENT

[75] Inventors: Kuang-Hung Lin, Taipei; Dong-Hsu Cheng, Hsin-chu, both of Taiwan

[73] Assignee: Taiwan Semiconductor Manufacturing Company Ltd., Hsin-Chu, Taiwan

[21] Appl. No.: 794,599

[22] Filed: Feb. 3, 1997

[51] Int. Cl.[6] .......... G03C 5/00

[52] U.S. Cl. .......... 430/313; 430/311; 430/327

[58] Field of Search .......... 430/313, 311, 430/327

[56] References Cited

U.S. PATENT DOCUMENTS

| | | | |
|---|---|---|---|
| 4,176,003 | 11/1979 | Brower et al. | 430/313 |
| 4,330,569 | 5/1982 | Gulett et al. | 427/38 |
| 5,153,685 | 10/1992 | Murata et al. | 357/23.6 |
| 5,275,972 | 1/1994 | Ogawa et al. | 437/195 |
| 5,326,643 | 7/1994 | Adamopoulos et al. | 428/472.2 |
| 5,372,677 | 12/1994 | Katayama et al. | 156/659.1 |
| 5,424,570 | 6/1995 | Sardella et al. | 257/333 |
| 5,486,267 | 1/1996 | Knight et al. | 156/659.11 |
| 5,552,339 | 9/1996 | Hsieh | 437/190 |
| 5,764,119 | 6/1998 | Miyagi et al. | 333/238 |

*Primary Examiner*—Janet C. Baxter
*Assistant Examiner*—Rosemary Ashton
*Attorney, Agent, or Firm*—George O. Saile; Stephen B. Ackerman; Rosemary L. S. Pike

[57] ABSTRACT

A new method to improve the adhesion of a photoresist layer to an underlying dielectric layer in the fabrication of integrated circuit devices is described. Semiconductor device structures are provided in and on a semiconductor substrate. A dielectric layer is deposited over the semiconductor device structures wherein the depositing is performed in a deposition chamber. The dielectric layer is treated with a $N_2O$ plasma treatment while the substrate is still within the deposition chamber. The substrate is removed from the deposition chamber. A photoresist mask is formed over the dielectric layer with an opening above the semiconductor device structures to be electrically contacted wherein the plasma treatment improves adhesion of the photoresist mask to the dielectric layer when compared to a conventional integrated circuit device. A contact opening is etched through the dielectric layer not covered by the mask to the semiconductor device structures to be electrically contacted. A conducting material is deposited within the contact opening completing the electrical contact in the fabrication of the integrated circuit device.

25 Claims, 3 Drawing Sheets

AVOID PHOTORESIST LIFTING BY POST-OXIDE-DEP PLASMA TREATMENT

BACKGROUND OF THE INVENTION (1) Field of the Invention

The invention relates to the fabrication of integrated circuit devices, and more particularly, to a method of improving the adhesion of photoresist on an oxide surface in the fabrication of integrated circuit devices.

(2) Description of the Prior Art

In the fabrication of integrated circuit devices, a contact or via process is often followed. A dielectric film is deposited, a pattern is made using a photolithographic process, then the pattern is duplicated on the film using a wet and dry etching process. The pattern usually consists of both isolated holes and clustered (matrix) holes in the circuit. Due to the effect of lightwave interference during exposure, the photoresist pattern of matrix holes may be oversized. This will result in an undercut of the photoresist after wet etching because of lateral etching in this process. In the extreme case, the photoresist will lift up at the oversized portion causing the contact or via hole to be destroyed or dislocated after dry etching. FIG. 1 illustrates an enlarged portion of a semiconductor substrate 10. Matrix hole photoresist mask 20 and 21 is shown overlying the layer 16 to be etched. First a wet etch A is performed. This is an isotropic etching which undercuts the photoresist. Poor resist adhesion may allow the wet etchant to penetrate the resist-dielectric interface, inducing a large x/y aspect ratio. In matrix holes with narrow spacing, the photoresist 21 may lift up entirely causing the hole to be oversized or destroyed after dry etching B.

There are three possible solutions to these failure potentials: 1) revise the design rule—decrease hole size and increase hole spacing, 2) expose the pattern using advanced steppers which exhibit better filtering devices to avoid light interference, or 3) increase photoresist adhesion to the dielectric layer. The first two solutions are not feasible because of practical considerations, such as desired packing density and cost limitations. The third solution, increasing photoresist adhesion, can be addressed.

Improved photoresist adhesion has been addressed by some workers in the field. U.S. Pat. No. 5,372,677 to Katayama et al teaches treating a first layer of photoresist with oxygen to improve adhesion of a second photoresist layer. U.S. Pat. No. 5,424,570 to Sardella et al teaches depositing an undoped oxide layer over BPSG to improve adhesion of a subsequent photoresist layer. U.S. Pat. No. 4,330,569 to Gulett et al discloses treating a dielectric layer with oxygen, then depositing a hexamethyldisilazane (HMDS) layer to improve adhesion of a photoresist layer. U.S. Pat. No. 5,486,267 to Knight et al teaches applying ozone or ozone plasma to a dielectric layer to improve adhesion with a preferably acid-catalyzed photoresist. U.S. Pat. No. 4,176,003 to Brower et al teaches treating polysilicon with oxygen to form a monolayer of oxide which will improve adhesion of a subsequent photoresist layer.

SUMMARY OF THE INVENTION

Accordingly, it is a principal object of the invention to provide an effective and very manufacturable method to improve adhesion of a photoresist layer in the fabrication of integrated circuit devices.

Another object of this invention is to provide a method improving adhesion of a photoresist layer to an underlying dielectric layer.

Yet another object of the invention is to improve adhesion of a photoresist layer by treating the underlying dielectric layer.

Yet another object is to improve adhesion of a photoresist layer by treating the underlying dielectric layer with a post-deposition plasma treatment.

A still further object of the invention is to improve adhesion of a photoresist layer by treating the underlying dielectric layer with a post-deposition $N_2O$ plasma treatment.

In accordance with these objects of this invention, a new method to improve the adhesion of a photoresist layer to an underlying dielectric layer in the fabrication of integrated circuit devices is achieved. Semiconductor device structures are provided in and on a semiconductor substrate. A dielectric layer is deposited over the semiconductor device structures wherein the depositing is performed in a deposition chamber. The dielectric layer is treated with a $N_2O$ plasma treatment while the substrate is still within the deposition chamber. The substrate is removed from the deposition chamber. A photoresist mask is formed over the dielectric layer with an opening above the semiconductor device structures to be electrically contacted wherein the plasma treatment improves adhesion of the photoresist mask to the dielectric layer when compared to a conventional integrated circuit device. A contact opening is etched through the dielectric layer not covered by the mask to the semiconductor device structures to be electrically contacted. A conducting material is deposited within the contact opening completing the electrical contact in the fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
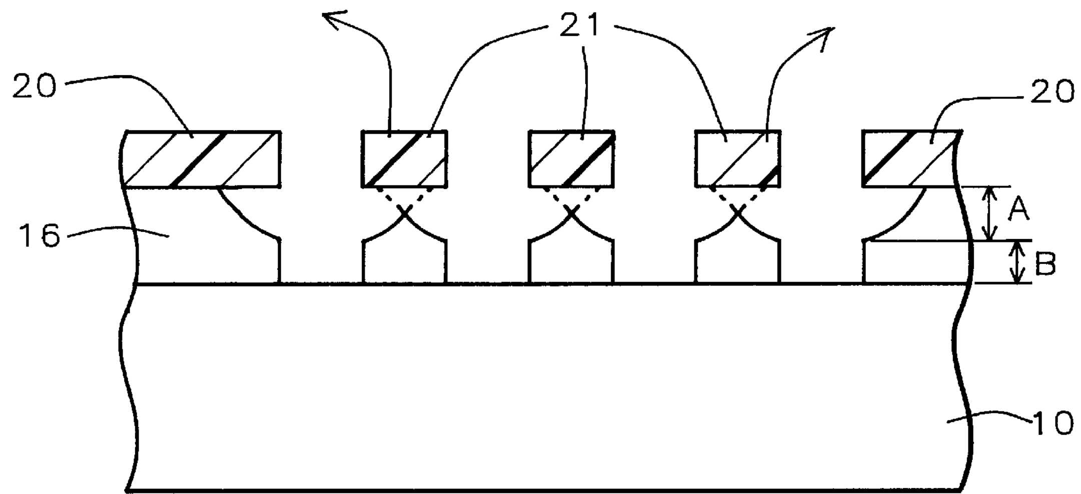
FIG. 1 schematically illustrates in cross-sectional representation an embodiment of the prior art.

The drawing figures illustrate an N-channel MOSFET integrated circuit device. However, it is well understood by those skilled in the art that a P-channel FET integrated circuit device could be formed by simply substituting opposite polarities to those given for the N-channel embodiment. Also, in a similar way, a CMOSFET could be formed by making both N channel and P channel devices upon the same substrate. Furthermore, it should be understood that the invention is not limited to the MOSFET embodiment illustrated in the figures, but can be used in the manufacture of any integrated circuit device in which a contact or via opening is to be made through a dielectric layer.

Figure 2:
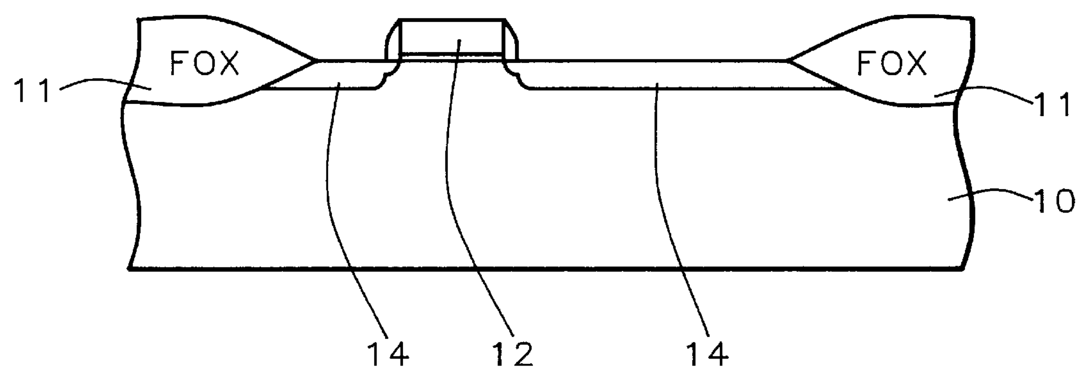
FIGS. 2 through 6 schematically illustrate in cross-sectional representation a preferred embodiment of the present invention.

Referring now more particularly to FIG. 2, there is illustrated a monocrystalline silicon semiconductor substrate 10. Field OXide regions 11, gate electrodes 12, and source and drain regions 14 have been formed in and on the semiconductor substrate as is conventional in the art.

Figure 3:
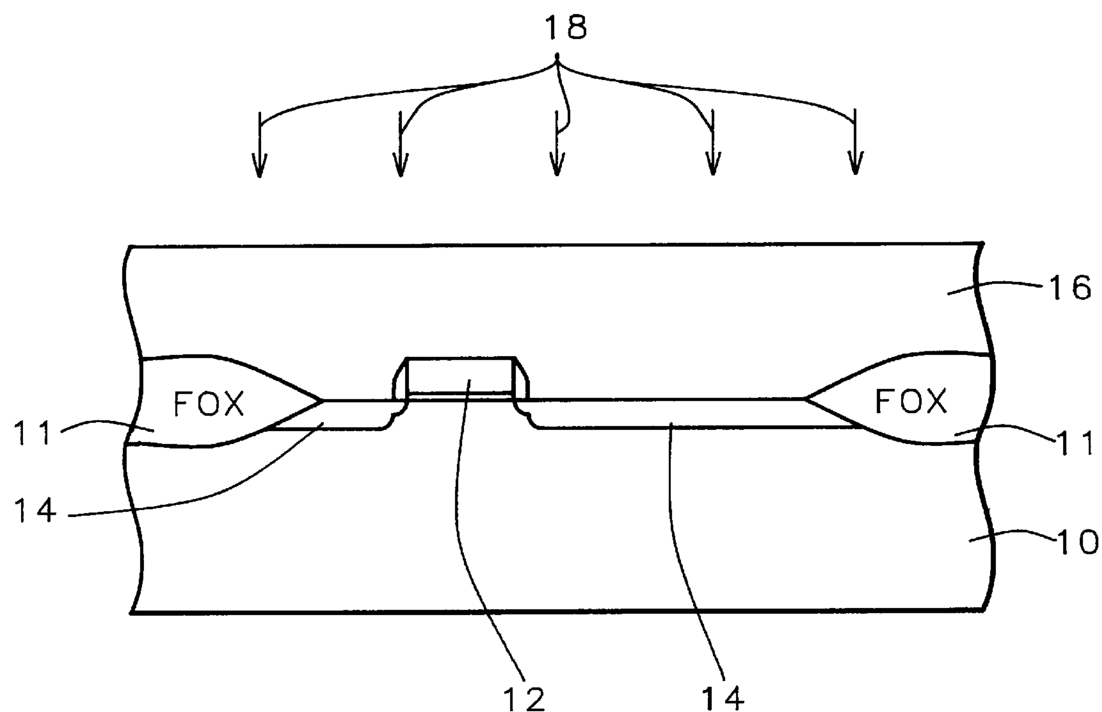

Referring now to FIG. 3, a dielectric layer 16 is deposited over the semiconductor device structures. The dielectric layer 16 comprises boron or phosphorus doped or undoped silicon oxide. Layer 16 may be a multi-layer so long as the topmost layer is an oxide. The oxide layer 16 is deposited by plasma enhanced chemical vapor deposition (PECVD) to a thickness of between about 3000 and 6000 Angstroms.

Immediately after the deposition of the dielectric layer 16, the in-situ plasma treatment of the present invention is performed. While the wafer is still within the deposition chamber, $N_2O$ plasma is applied to the wafer. $N_2O$ plasma is an optional addition to the typical deposition chamber because it is normally applied on spin-on-glass coatings to avoid outgassing which may cause so-called poisoned via.

The $N_2O$ plasma treatment comprises flowing $N_2O$ plasma at a rate of between about 500 and 2000 sccm for between about 5 and 60 seconds at a temperature of 200° to 500° C., power of 100 to 500 watts, and a pressure of 2 to 10 Torr. Alternatively, $N_2$ or Ar plasma could be used instead of the $N_2O$ plasma, resulting in the same photoresist adhesion improvement.

The $N_2O$ plasma 18 applied to the dielectric layer 16 may change the surface characteristics of the top oxide layer which greatly improves the adhesion of a subsequently deposited photoresist layer. The $N_2O$ plasma treatment makes the oxide surface rough and hence increases the area of the adhesion surface. The treatment also changes the surface bonding of the oxide to resist interface which improves adhesion.

Since the plasma treatment is done in-situ, no additional equipment or process steps are required. Very little increase in operation time and cost is added to the fabrication process.

The plasma treatment conditions can be varied within the ranges given to result in the desired shape of the contact or via hole.

Figure 4:
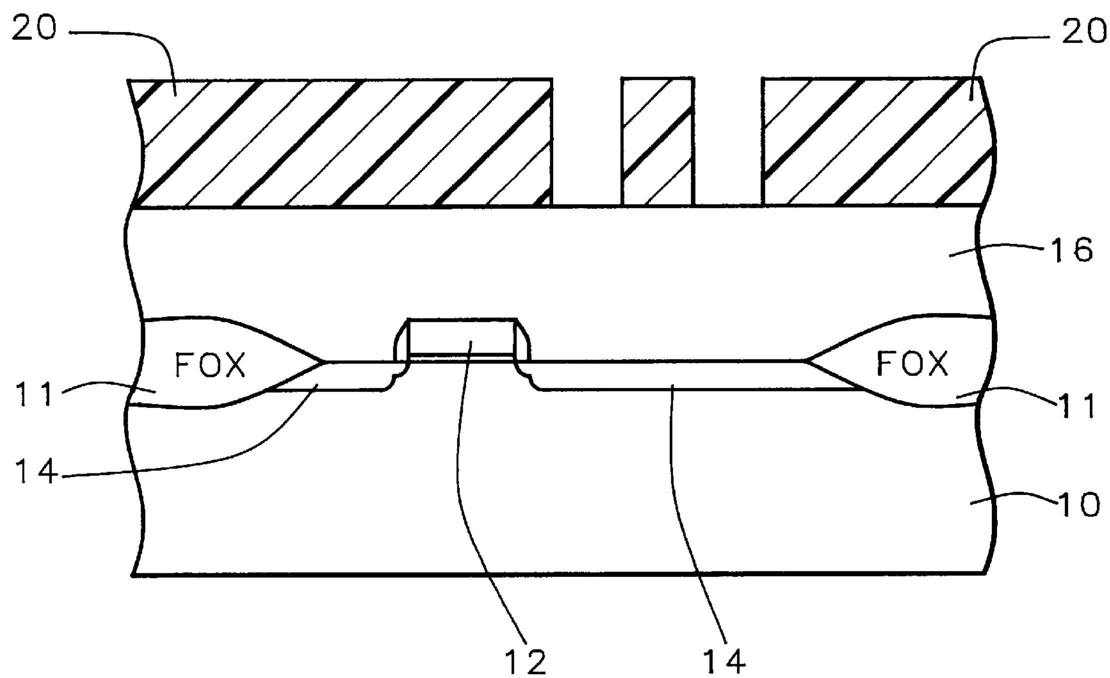

The contact or via openings are now formed through the dielectric layer, for example, to the source/drain regions 14. Referring to FIG. 4, a photoresist mask 20 is formed by lithography and etching techniques over the dielectric layer 16 to provide openings over the device elements to be electrically contacted. A matrix hole pattern is illustrated in FIG. 4.

Figure 5:
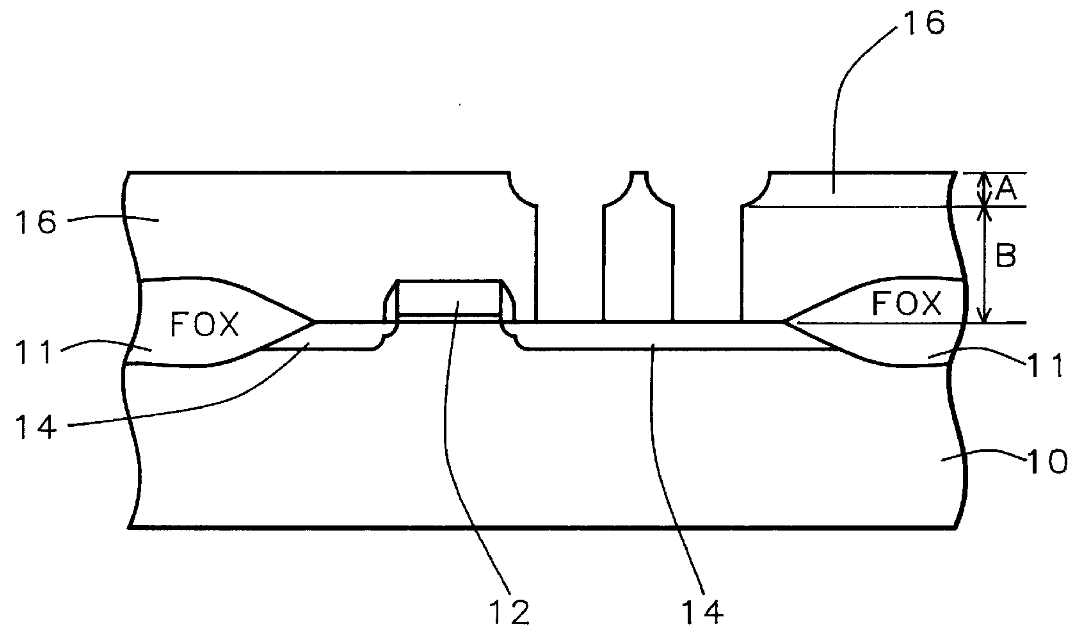

The contact or via opening is etched through the dielectric layer 16, as illustrated in FIG. 5, using a combination wet and dry etch process. The wet etch is an isotropic etching process using a chemical in a liquid state such as a hydrofluoric acid (HF) solution. The wet etch process etches in both the horizontal x and vertical y directions resulting in a particular x/y aspect ratio. The wet etching is stopped at the desired trench depth. The portion of the contact/via opening formed by the wet etching process is illustrated by A on FIG. 5. Next, a plasma dry etch, which is an anisotropic etching process, forms the fully developed contact profile illustrated by B in FIG. 5. Poor resist adhesion allows the wet etchant to penetrate into the resist-dielectric interface, increasing the lateral etching rate and causing the contact opening to be oversized. The improved resist adhesion of the present invention prevents the penetration of the resist-dielectric interface by the wet etchant improving the controllablity of the etching process.

In experiments, the inventors have found that without the inventive plasma treatment, the photoresist is lifted up during wet etching resulting in oversizing of the contact/via openings, or destruction of the openings in the extreme case. With the inventive plasma treatment, there is no oversizing of the openings and no photoresist lift up.

Figure 6:
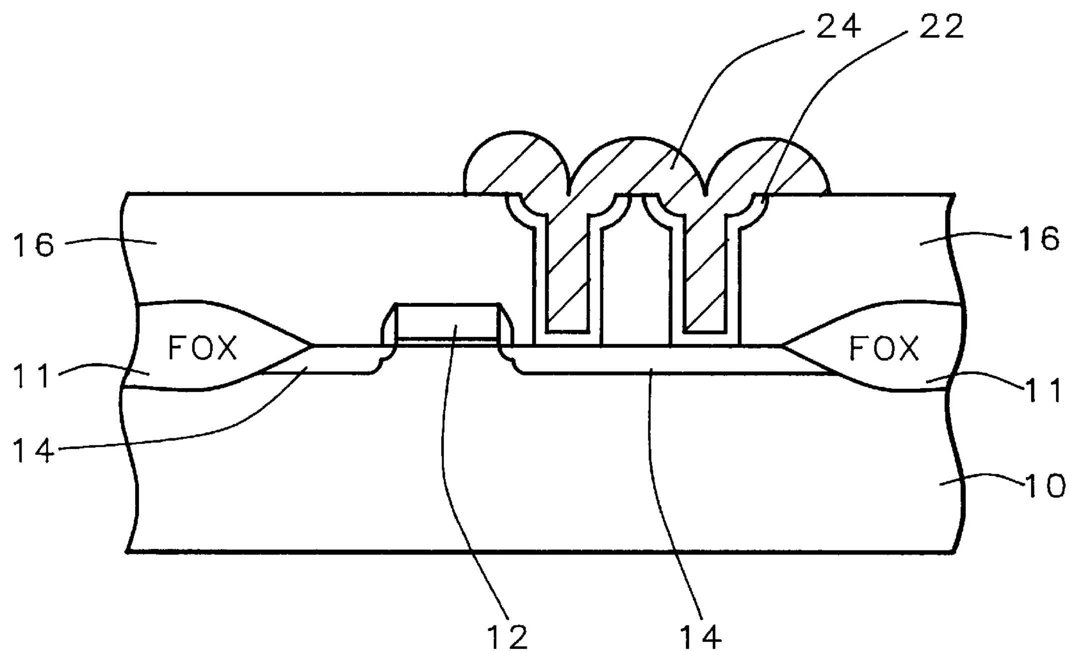

After the etching is completed, the photoresist layer is removed. Processing continues as is conventional in the art. A glue layer 22, such as titanium nitride/titanium, is sputter deposited into the via holes. A conducting layer 24 is then deposited to fill the via openings and patterned to form the desired metallurgy pattern, as shown in FIG. 6. The conducting layer may be aluminum or tungsten or the like. Further levels of metallurgy are formed as desired. The process of the invention results in improved adhesion of the photoresist layer to the underlying dielectric layer. This leads to a reduced lateral wet etching rate of the oxide since the resist-oxide interface is not penetrated by the wet etchant. Therefore, the contact or via hole matrix will not be oversized or dislocated. The shape of the contact or via hole can be manipulated thus improving metal step coverage. All this is accomplished with a minimum increase in operation time and cost and with no additional equipment or process steps.

While the invention has been particularly shown and described with reference to the preferred embodiments thereof, it will be understood by those skilled in the art that various changes in form and details may be made without departing from the spirit and scope of the invention.

What is claimed is:

1. A method for making an electrical contact in the fabrication of an integrated circuit device comprising:

providing semiconductor device structures in and on a semiconductor substrate;

depositing a dielectric layer over said semiconductor device structures wherein said depositing is performed in a deposition chamber and wherein at least the top portion of said dielectric layer comprises silicon oxide;

treating said dielectric layer with a plasma treatment selected from the group containing $N_2O$, $N_2$, and Ar while said substrate is still within said deposition chamber;

removing said substrate from said deposition chamber;

forming a photoresist mask over said dielectric layer with an opening above said semiconductor device structures to be electrically contacted wherein said plasma treatment improves adhesion of said photoresist mask to said dielectric layer when compared to a conventional integrated circuit device;

etching a contact opening through said dielectric layer not covered by said mask to said semiconductor device structures to be electrically contacted; and depositing a conducting material within said contact opening completing said electrical contact in the fabrication of said integrated circuit device.

2. The method according to claim 1 wherein said semiconductor device structures to be electrically contacted are source/drain regions of a CMOS integrated circuit device.

3. The method according to claim 1 wherein said semiconductor device structures are a metallurgy layer and said electrical contact is a via metallurgy between metal layers in said integrated circuit device.

4. The method according to claim 1 wherein said dielectric layer structure is composed of silicon oxide doped with one of the group including boron and phosphorus.

5. The method according to claim 1 wherein said dielectric layer structure is composed of undoped silicon oxide.

6. The method according to claim 1 wherein the conditions within said deposition chamber are a temperature of between about 200° and 500° C., a pressure of between about 2 and 10 torr, and a radio frequency of between about 100 and 500 watts.

7. The method according to claim 1 wherein said plasma treatment comprises flowing $N_2O$ plasma at the rate of between about 500 and 2000 sccm for a duration of between about 5 and 60 seconds.

8. The method according to claim 1 wherein said plasma treatment comprises flowing $N_2$ plasma at the rate of between about 500 and 2000 sccm for a duration of between about 5 and 60 seconds.

9. The method according to claim 1 wherein said plasma treatment comprises flowing Ar plasma at the rate of between about 500 and 2000 sccm for a duration of between about 5 and 60 seconds.

10. The method according to claim 1 further comprising depositing a glue layer underlying said conducting layer.

11. The method according to claim 10 wherein said glue layer comprises a first layer of titanium nitride and a second layer of titanium.

12. The method according to claim 1 wherein said etching comprises a first isotropic wet etch followed by a second anisotropic dry etch.

13. The method according to claim 1 wherein said conducting layer comprises a metal.

14. A method for making an electrical contact in the fabrication of an integrated circuit device comprising:

providing semiconductor device structures in and on a semiconductor substrate;

depositing a silicon oxide layer over said semiconductor device structures wherein said depositing is performed in a deposition chamber;

treating said silicon oxide layer with a plasma treatment selected from the group containing $N_2O$, $N_2$, and Ar while said substrate is still within said deposition chamber;

removing said substrate from said deposition chamber;

forming a photoresist mask over said silicon oxide layer with an opening above said semiconductor device structures to be electrically contacted wherein said plasma treatment improves adhesion of said photoresist mask to said silicon oxide layer when compared to a conventional integrated circuit device;

etching a contact opening through said silicon oxide layer not covered by said mask to said semiconductor device structures to be electrically contacted; and depositing a conducting material within said contact opening completing said electrical contact in the fabrication of said integrated circuit device.

15. The method according to claim 14 wherein said semiconductor device structures to be electrically contacted are source/drain regions of a CMOS integrated circuit device.

16. The method according to claim 14 wherein said semiconductor device structures are a metallurgy layer and said electrical contact is a via metallurgy between metal layers in said integrated circuit device.

17. The method according to claim 14 wherein said silicon oxide layer is doped with one of the group including boron and phosphorus.

18. The method according to claim 14 wherein said silicon oxide layer is undoped.

19. The method according to claim 14 wherein the conditions within said deposition chamber are a temperature of between about 200° and 500° C., a pressure of between about 2 and 10 torr, and a radio frequency of between about 100 to 500 watts.

20. The method according to claim 14 wherein said plasma is flowed at the rate of between about 500 and 2000 sccm for a duration of between about 5 and 60 seconds.

21. A method for making an electrical contact in the fabrication of an integrated circuit device wherein photoresist adhesion is improved in the inventive integrated circuit device when compared to photoresist adhesion in a conventional integrated circuit device comprising:

providing semiconductor device structures in and on a semiconductor substrate;

depositing a silicon oxide dielectric layer over said semiconductor device structures wherein said depositing is performed in a deposition chamber;

treating said dielectric layer with a plasma treatment whereby the surface of said dielectric layer is roughened wherein said plasma comprises one of the group containing $N_2O$, $N_2$, and Ar while said substrate is still within said deposition chamber;

removing said substrate from said deposition chamber;

forming a photoresist mask over said dielectric layer with an opening above said semiconductor device structures to be electrically contacted wherein said roughened surface of said dielectric layer allows for better photoresist adhesion of said photoresist mask to said dielectric layer when compared to said photoresist adhesion in said conventional integrated circuit device;

etching a contact opening through said dielectric layer not covered by said mask to said semiconductor device structures to be electrically contacted; and depositing a conducting material within said contact opening completing said electrical contact in the fabrication of said integrated circuit device.

22. The method according to claim 21 wherein said semiconductor device structures to be electrically contacted are source/drain regions of a CMOS integrated circuit device.

23. The method according to claim 21 wherein said semiconductor device structures are a metallurgy layer and said electrical contact is a via metallurgy between metal layers in said integrated circuit device.

24. The method according to claim 21 wherein said plasma treatment conditions comprise flowing said plasma at the rate of between about 500 and 2000 sccm for a duration of between about 5 and 60 seconds at a temperature of between about 200° and 500° C., a pressure of between about 2 and 10 torr, and a radio frequency of between about 100 and 500 watts.

25. The method according to claim 24 wherein said etching comprises a first isotropic wet etch followed by a second anisotropic dry etch and wherein the profile of said contact opening can be manipulated by changing said plasma treatment conditions.

* * * * *